(12) United States Patent
Lai et al.

(10) Patent No.: US 8,318,409 B2
(45) Date of Patent: Nov. 27, 2012

(54) DYNAMIC MASKING METHOD FOR MICRO-TRUSS FOAM FABRICATION

(75) Inventors: Yeh-Hung Lai, Webster, NY (US); Gerald W. Fly, Geneseo, NY (US); Jeffrey A. Rock, Fairport, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 451 days.

(21) Appl. No.: 12/603,120

(22) Filed: Oct. 21, 2009

(65) Prior Publication Data
US 2011/0090480 A1 Apr. 21, 2011

(51) Int. Cl.
*G03F 7/20* (2006.01)
(52) U.S. Cl. .................................................. 430/311
(58) Field of Classification Search ............. 430/322, 430/5, 311
See application file for complete search history.

(56) References Cited

U.S. PATENT DOCUMENTS

| | | | |
|---|---|---|---|
| 6,274,288 B1 | 8/2001 | Kewitsch et al. | |
| 7,382,959 B1 | 6/2008 | Jacobsen | |
| 2002/0146627 A1* | 10/2002 | Suleski et al. | 430/5 |
| 2003/0036750 A1* | 2/2003 | Ruiz et al. | 606/5 |
| 2010/0003623 A1* | 1/2010 | Liu | 430/326 |

OTHER PUBLICATIONS

Microstereolithography: Concepts and applications; Arnaud Bertsch, Paul Bernhard, Philippe Renaud; (c) 2001 IEEE.
Microstereolithography: a Review; Arnard Bertsch, Sebastien Jiguet, Paul Bernhard, Philippe Renaud; Swiss Federal Institute of Technology,(c) 2003 Material Research Society.
Fabrication and moulding of cellular materials by rapid prototyping; J. Stampfl, H. Houad and S. Seidler; Institute of Material Science and Testing, Vienna University of Technology, Austria; R Liska and F. Schwager; Institute of Applied Synthetic Chemistry, Vienna University of Technology, Austria; A Woesz and P Fratzl; Max Planck Institute of Colloids and Interfaces, Germany.
Characterisation of Epoxy Resins for Microstereolithographic Rapid Prototyping; C.R. Chatwin, M. Farsari, S. Huang, M.I. Heywood, R.C.D. Young, P.M. Birch, F. Claret-Tournier and J.D. Richardson, School of Engineering, University of Sussex, Falmer, Brighton, UK; (c) 1999 Springer-Verlag London Limited.
Acta Materialia 55 (2007) 6724-6733, Compression behavior of micro-scale truss structures formed from self-propagating polymer waveguides; Alan J. Jacobsen, William Barvosa-Carter, Steven Nutt. Published by Elsevier Ltd.
Hong-Bo Sun, Satoshi Kawata; Two-Photon Photopolymerization and 3D Lithographic Microfabrication; Department of Applied Physics, Osaka University, Japan; APS (2004) 170: 169-273.

* cited by examiner

*Primary Examiner* — Brittany Raymond
(74) *Attorney, Agent, or Firm* — Fraser Clemens Martin & Miller LLC; J. Douglas Miller

(57) ABSTRACT

A system for fabricating a radiation-cured structure is provided. The system includes a radiation-sensitive material configured to at least one of initiate, polymerize, crosslink and dissociate with exposure to radiation. At least one radiation source is configured to project a radiation beam toward the radiation-sensitive material. A smart glass device is disposed between the radiation-sensitive material and the at least one radiation source. The smart glass device includes at least one switchable layer selectively operable from an active state to an inactive state. The smart glass device is configured to expose the radiation-sensitive material to a desired exposure pattern when in one of the active state and the inactive state. A method for fabricating the radiation-cured structure is also provided.

16 Claims, 1 Drawing Sheet

DYNAMIC MASKING METHOD FOR MICRO-TRUSS FOAM FABRICATION

FIELD OF THE INVENTION

The present disclosure relates to a fuel cell component and more particularly to a dynamic masking method for fabricating the fuel cell component.

BACKGROUND OF THE INVENTION

A fuel cell has been proposed as a clean, efficient and environmentally responsible power source for electric vehicles and various other applications. Individual fuel cells can be stacked together in series to form a fuel cell stack for various applications. The fuel cell stack is capable of supplying a quantity of electricity sufficient to power a vehicle. In particular, the fuel cell stack has been identified as a potential alternative for the traditional internal-combustion engine used in modern automobiles.

One type of fuel cell is the polymer electrolyte membrane (PEM) fuel cell. The PEM fuel cell includes three basic components: an electrolyte membrane; and a pair of electrodes, including a cathode and an anode. The electrolyte membrane is sandwiched between the electrodes to form a membrane-electrode-assembly (MEA). The MEA is typically disposed between porous diffusion media (DM) such as carbon fiber paper, which facilitates a delivery of reactants such as hydrogen to the anode and oxygen to the cathode. In the electrochemical fuel cell reaction, the hydrogen is catalytically oxidized in the anode to generate free protons and electrons. The protons pass through the electrolyte to the cathode. The electrons from the anode cannot pass through the electrolyte membrane, and are instead directed as an electric current to the cathode through an electrical load such as an electric motor. The protons react with the oxygen and the electrons in the cathode to generate water.

It has been desirable to fabricate the fuel cell and related fuel cell components from radiation-cured structures. The formation of radiation-cured structures such as microtruss structures are described in Assignee's co-pending U.S. patent application Ser. No. 12/339,308, the entire disclosure of which is hereby incorporated herein by reference. The formation of radiation-cured fuel cell structures are further described in Assignee's co-pending U.S. patent application Ser. Nos. 12/341,062 and 12/341,105, the entire disclosures of which are hereby incorporated herein by reference.

Radiation-cured microtruss structures and methodology are described by Jacobsen et al. in "Compression behavior of micro-scale truss structures formed from self-propagating polymer waveguides", Acta Materialia 55, (2007) 6724-6733, the entire disclosure of which is hereby incorporated herein by reference. One particular method and system of creating radiation-cured structures is disclosed by Jacobsen in U.S. Pat. No. 7,382,959, the entire disclosure of which is hereby incorporated herein by reference. Further radiation-cured structures are disclosed by Jacobsen in U.S. patent application Ser. No. 11/801,908, the entire disclosure of which is hereby incorporated herein by reference.

Typically, the radiation-cured structures are formed from radiation-sensitive materials such as radiation-curable materials and radiation-dissociable materials. The radiation-cured structure is generally formed by a method including the steps of: providing the radiation-sensitive material; placing a mask between an at least one radiation source and the radiation-sensitive material, the mask having a plurality of substantially radiation-transparent apertures formed therein; and exposing the radiation-sensitive material to a plurality of radiation beams through the radiation-transparent apertures in the mask. The apertures of the mask may be selected to provide different radiation cured structures. To form complex or multi-layered radiation cured structures, different masks having different apertures are generally sequentially applied. Undesirably, masks must be removed following radiation exposure so that further radiation-cured structure may be fabricated. Since masks typically are placed in physical contact with the radiation-sensitive material, the masks must also be cleaned after use in order to remove residual radiation-sensitive material. Although it is possible to achieve multiple radiation exposures through repeated release and application of masks, this methodology can be quite complicated and costly.

There is a continuing need for an efficient and cost effective system and method for fabricating radiation-cured structures. Desirably, the system and method provide complex radiation-cured structures without employing costly and inefficient masking techniques, processing steps, and cleaning steps.

SUMMARY OF THE INVENTION

In concordance with the instant disclosure, an efficient and cost effective system and method for fabricating radiation-cured structures, and for providing complex radiation-cured structures without employing costly and inefficient masking techniques, processing steps, and cleaning steps, is surprisingly discovered.

In a first embodiment, a system for fabricating a radiation-cured structure includes a radiation-sensitive material configured to at least one of initiate, polymerize, crosslink and dissociate with exposure to radiation. At least one radiation source is configured to project a radiation beam toward the radiation-sensitive material. A smart glass device is disposed between the radiation-sensitive material and the at least one radiation source. The smart glass device includes at least one switchable layer selectively configurable from an active state to an inactive state. The smart glass device is configured to selectively expose the radiation-sensitive material to a desired exposure pattern when in one of the active state and the inactive state.

In another embodiment, a system for fabricating a radiation-cured structure includes a smart glass device with a first switchable layer and a second switchable layer. The first and second switchable layers are disposed on a substantially radiation-transparent support. Each of the first and second switchable layers is independently selectively configurable from the active state to the inactive state. The active state is substantially radiation-transparent and the inactive state is substantially radiation-opaque with a plurality of radiation-transparent apertures. The radiation-transparent apertures permit a selective exposing of the radiation-sensitive material to the desired exposure pattern. The inactive state of the first switchable layer is configured to provide a first desired exposure pattern, and the inactive state of the second switchable layer is configured to provide a second desired exposure pattern. The first desired exposure pattern is different from the second desired exposure pattern.

In a further embodiment, a method for fabricating a radiation-cured structure includes the steps of: providing a radiation-sensitive material configured to at least one of initiate, polymerize, crosslink and dissociate with exposure to radiation; providing an at least one radiation source configured to project a radiation beam toward the radiation-sensitive material; providing a smart glass device including at least one switchable layer selectively configurable from an active state to an inactive state and configured to expose the radiation-sensitive material to a desired exposure pattern when in one of the active state and the inactive state; positioning the smart glass device between the radiation-sensitive material and the at least one radiation source; switching the at least one switchable layer to one of the active state and the inactive state; directing the radiation beam through the smart glass device to provide the desired exposure pattern; exposing the radiation-sensitive material to the desired exposure pattern; and forming a radiation-cured structure by at least one of polymerizing, crosslinking and dissociating the radiation-sensitive material with the desired exposure pattern.

DRAWINGS

The above, as well as other advantages of the present disclosure, will become readily apparent to those skilled in the art from the following detailed description, particularly when considered in the light of the drawings described herein.

DETAILED DESCRIPTION OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, are not necessary or critical.

Figure 1:
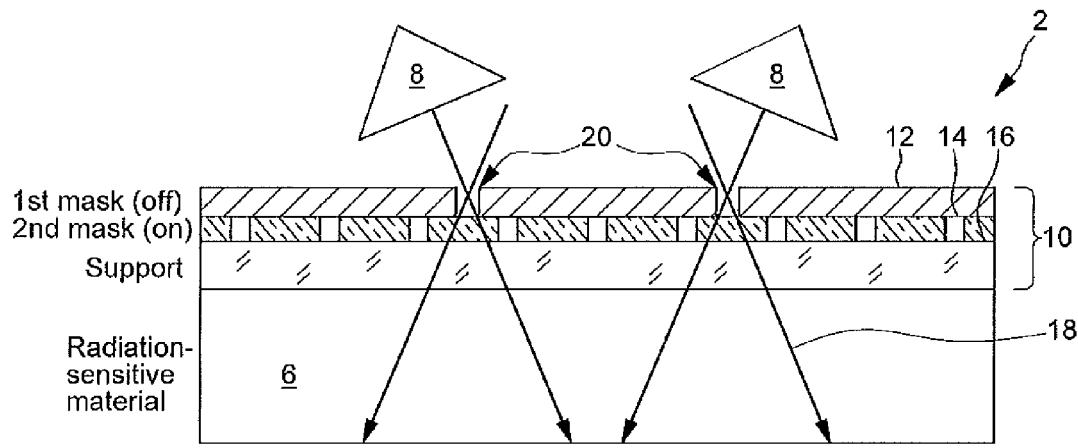
FIG. 1 is a schematic illustration of the system and method for fabricating radiation-cured structures according to an embodiment the present disclosure, with one of a pair of suspended particle devices shown in an active state.
Figure 2:
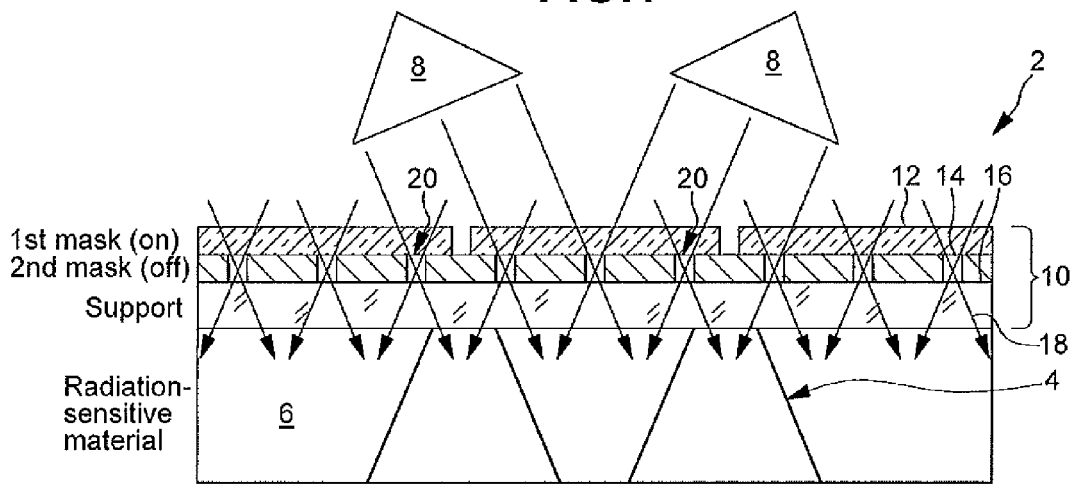
FIG. 2 is a schematic illustration of the system and method shown in FIG. 1, with the other of the pair of smart glass devices shown in an active state.
Figure 3:
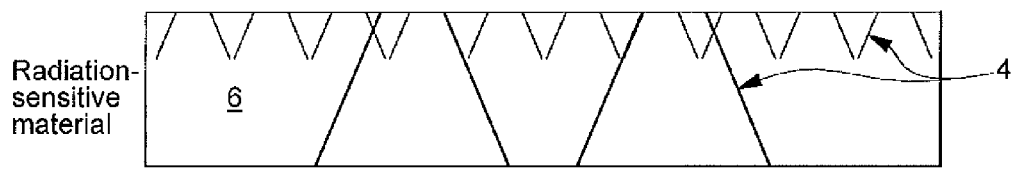
FIG. 3 is a schematic illustration of the system shown in FIGS. 1 and 2, further having pair of smart glass devices removed to leave a radiation-cured structure.

FIGS. 1 to 3 show a system 2 for fabricating radiation-cured structures 4 according to the present disclosure. The radiation-cured structures 4 may illustratively be employed as radiation-cured fuel cell components such as diffusion media, bipolar plates, subgaskets, and the like. However, it should be appreciated that the disclosed system 2 and method is not limited to fuel cell components, and may be used for fabrication of radiation-cured structures 4 for other purposes, as desired. The terminology related to the fabrication of radiation-cured structures 4, appropriated herein relative to the present system 2 and method, is further described in Assignee's co-pending U.S. patent application Ser. Nos. 12/339,308, 12/341,062 and 12/341,105, the entire disclosures of which are hereby incorporated herein by reference.

The system 2 includes a radiation-sensitive material 6, at least one radiation source 8, and a smart glass device 10. The radiation-sensitive material 6 is configured to at least one of initiate, polymerize, and crosslink and dissociate with exposure to radiation. The radiation-sensitive material 6 may be disposed on a substrate (not shown), placed in a container or reservoir if liquid, or provided as a free standing film, depending on the type of radiation-sensitive material 6 selected. The at least one radiation source 8 may be disposed adjacent the radiation sensitive material 6. The smart glass device 10 may also be disposed between the radiation-sensitive material 6 and the radiation source 8. It should be appreciated that the smart glass device 10 may be spaced apart from, or atop and abutting, the radiation-sensitive material 6, as desired.

The smart glass device 10 may include at least one switchable layer 12, 14. The at least one switchable layer 12, 14 is selectively operable from an active state to an inactive state. The at least one switchable layer 12, 14 is configured to expose the radiation-sensitive material 6 to a desired exposure pattern when in one of the active state and the inactive state. Illustratively, the at least one switchable layer 12, 14 may be disposed atop a substantially radiation-transparent support 16. The radiation-transparent support 16 may be formed from a plane of glass such as quartz glass, for example, or a plastic sheet such as Mylar® plastic, for example. The radiation-transparent support 16 may facilitate the handling and placement of the smart glass device 10 between the radiation-sensitive material 6 and the radiation source 8, as desired.

The at least one radiation source 8 is configured to project a radiation beam 18 toward the radiation-sensitive material 6. The at least one radiation source 8 is desirably configured to project the radiation beam 18 along a vector that intersects the smart glass device 10 before reaching the radiation-sensitive material 6. It should be appreciated that the radiation may be collimated or partially collimated, as desired. In particular embodiments, the radiation is electromagnetic radiation such as ultraviolet (UV) light, although it is understood that other forms of electromagnetic radiation may also be employed within the scope of the disclosure.

The smart glass device 10 of the instant disclosure is configured to selectively provide the desired exposure pattern of the radiation beam 18 to the radiation-sensitive material 6. In particular embodiments, the smart glass device 10 includes a first switchable layer 12 and a second switchable layer 14. The first and second switchable layers 12, 14 may be laminated onto the substantially radiation-transparent support 16, for example. Each of the first and second switchable layers 12, 14 are independently selectively operable from the active state to the inactive state. Where the first and second switchable layers 12, 14 are in the active state, the first and second switchable layers 12, 14 are substantially radiation-transparent. Where the first and second switchable layers 12, 14 are in the inactive state, the first and second switchable layers 12, 14 are substantially radiation-opaque and include a plurality of radiation-transparent apertures 20. The apertures 20 may be formed by perforations or holes formed in first and second switchable layers 12, 14, for example. Although the smart glass device 10 is described herein with respect to first and second switchable layers 12, 14, it should be understood that the employment of additional switchable layers are within the scope of the present disclosure.

The radiation-transparent apertures 20 of the smart glass device 10 permit an exposing of the radiation-sensitive material 6 to the desired exposure pattern caused thereby when the smart glass device 10 is disposed between the radiation sensitive material 6 and the radiation source 8. The radiation-transparent apertures 20 may have shapes that provide elements of the radiation-cured structure 4 with desired cross-sectional shapes. In one embodiment, the radiation-transparent apertures 20 are in the form of substantially circular holes that provide radiation beams 18 to form radiation-cured columns with substantially circular or elliptical cross-sectional shapes. In another embodiment, the radiation-transparent apertures 20 are elongate slots that provide radiation beams 18 to form radiation-cured walls with substantially rectangular cross-sectional shapes. It should be understood that the shapes and sizes of the radiation-transparent apertures 20 may be selected to provide the desired exposure pattern.

In a particularly illustrative embodiment, the inactive state of the first switchable layer 12 is configured to provide a first desired exposure pattern, and the inactive state of the second switchable layer 14 is configured to provide a second desired exposure pattern. The first desired exposure pattern may be different from the second desired exposure pattern. In other embodiments, the first desired exposure pattern has at least one of an intensity and a frequency different from at least one of an intensity and a frequency of the second desired exposure pattern. The rates at which different portions of the radiation-cured structure 4 are formed by be different depending on which of the first and second desired exposure patterns is employed. The first and second desired exposure patterns may include different types of radiation, such as where layered radiation sensitive materials with different radiation sensitivities are employed, for example, as described in Assignee's co-pending U.S. application Ser. No. 12/339,308, the entire disclosure of which is hereby incorporated herein by reference. As a nonlimiting example, multiple radiation sources 8 providing different types of radiation beams 18 and/or radiation beams 18 along different vectors, may be employed. The multiple radiation sources 8 may also be disposed at a single station, or at different stations, as desired. A skilled artisan should appreciate that the activation of the radiation sources 8 and the smart glass device 10 may be coordinated to provide the desired exposure pattern.

Where the first switchable layer 12 is placed in the inactive state, the second switchable layer 14 is placed in the active state to be made substantially radiation-transparent. Likewise, where the second switchable layer 14 is placed in the inactive state, the first switchable layer 12 is placed in the active state to be made substantially radiation-transparent. The first desired exposure pattern may thereby provide a first portion of the radiation-cured structure 4, such as a coarse microtruss structure, and the second desired exposure pattern may provide a second portion of the radiation-cured structure 4, such as a fine microtruss structure. One of ordinary skill in the art may select other exposure patterns to provide other radiation-cured structures 4, as desired.

The switchable layers 12, 14 of the smart glass device 10 may be switched from the inactive state to the active state, and vice-versa, through the use of at least one programmable controller (not shown) in electrical communication therewith. The programmable controller may control an application of a voltage or current to the smart glass device 10 from a power supply (not shown), for example.

As nonlimiting examples, the at least one layer 12, 14 of the smart glass device 10 is one of an electrochromic device, a suspended particle device (SPD), and a liquid crystal device (LCD). Electrochromic-based smart glass devices 10 change radiation transmission properties in response to voltage, and thereby allow control of the radiation passing therethrough. In electrochromic devices, the electrochromic material changes opacity with application of the voltage from the power supply. Advantageously, once the change has been effectuated, no additional electricity is needed to maintain the opacity of the smart glass device 10. The electrochromic device may absorb radiation while in the inactive state and become substantially radiation-transparent when in the active state. In another embodiment, the electrochromic device may become reflective and mirror-like in the inactive state.

In SPD-based smart glass devices 10, a thin film laminate of rod-like particles is suspended in a fluid placed between two layers, such as glass or plastic layers. Alternatively, the thin film laminate is attached to the layer. When no voltage is applied, i.e., when the SPD is in the inactive state, the suspended particles are arranged in random orientations and absorb radiation, the laminate effectively becoming radiation-opaque. When voltage from the power supply is applied to place the SPD in the active state, the suspended particles align and let radiation pass therethrough. SPDs can be dimmed, and allow fine control of the amount of radiation passing therethrough. It should be understood that a minimal, constant electrical current may be required to maintain the SPD in the active state.

In LCD-based smart glass devices 10, liquid crystals are dissolved or dispersed in a liquid polymer, followed by a solidification or a curing of the polymer. During the change of the polymer from a liquid to a solid, the liquid crystals become incompatible with the solid polymer and form droplets throughout the solid polymer. The curing conditions affect the size of the droplets, which in turn affects the final operating properties of the LCD-based smart glass device 10. The compound of polymer and liquid crystals may be placed between two layers, such as glass or plastic layers, which further include a thin layer of a transparent, conductive material, thereby forming a basic sandwich structure of the smart glass device 10.

Electrodes from the power supply are attached to the transparent conductive material of the LCD-based smart glass devices 10. Where no voltage is applied, i.e., where the LCD-based smart glass device 10 is in the inactive state, the liquid crystals are randomly arranged in the droplets, resulting in scattering and absorption of radiation. Where a voltage is applied to place the LCD-based smart glass device 10 in the active state, an electric field formed between the electrodes cause the liquid crystals to align, thereby allowing radiation to pass through the droplets with limited scattering.

The intensity of the radiation passing through the LCD-based smart glass device 10 may be controlled by the voltage applied thereto. For example, at lower voltages, fewer of the liquid crystals are able to be aligned completely in the electric field than when higher voltages are applied. Accordingly, less radiation may pass through the smart glass device 10, resulting in a lower intensity as compared to the intensity of radiation passing through the smart glass device 10 at the higher voltage.

As shown in FIGS. 1 to 3, the present disclosure further includes a method for fabricating the radiation-cured structure 4. The method first includes the steps of: providing the radiation-sensitive material 6 configured to at least one of initiate, polymerize, crosslink and dissociate with exposure to radiation; providing the at least one radiation source 8 configured to project the radiation beam toward the radiation-sensitive material 6; and providing the smart glass device 10 including the at least one switchable layer 12, 14 selectively operable from the active state to the inactive state and configured to expose the radiation-sensitive material 6 to the desired exposure pattern when in one of the active state and the inactive state.

The smart glass device 10 is positioned between the radiation-sensitive material 6 and the at least one radiation source 8. For example, the smart glass device 10 maybe placed atop and abut the radiation-sensitive material 6. In another example, the smart glass device 10 is positioned spaced apart from the radiation-sensitive material 6.

Following the positioning of the smart glass device 10 between the radiation-sensitive material 6 and the at least one radiation source 8, the at least one switchable layer 12, 14 is switched to one of the active state and the inactive state. Where the at least one switchable layer 12, 14 is in one of the active state and the inactive state, the desired exposure pattern is provided when the radiation beam 18 from the at least one radiation source 8 is directed through the smart glass device 10. It should be appreciated that the radiation-sensitive material 6 is then exposed to the desired exposure pattern.

Upon exposing the radiation-sensitive material 6 to the desired exposure pattern, the radiation cured structure 4 may be formed. For example, the radiation cured structure 4 may be formed by polymerization, crosslinking, or dissociation of the radiation-sensitive material 6. In particular embodiments, the step of forming the radiation-cured structure 4 further includes the step of heating the radiation-sensitive material 6 following the step of exposing the radiation-sensitive material 6 to the desired exposure pattern. For example, where the exposing of the radiation-sensitive material 6 results in an initiation of the radiation-sensitive material 6, the heating may facilitate further polymerization, crosslinking, or dissociation of the radiation-sensitive material 6 to form the radiation-cured structure 4. The step of forming the radiation-cured structure 4 may further include the step of removing an uncured or dissociated portion of the radiation-sensitive material 6 following the step of forming the radiation-cured structure 4.

In certain embodiments, the method of the disclosure includes providing the smart glass device 10 with the first switchable layer 12 and the second switchable layer 14. The first and second switchable layers 12, 14 are disposed on the substantially radiation-transparent support 16. Each of the first and second switchable layers 12, 14 are independently selectively operable from the active state to the inactive state. The active state is substantially radiation-transparent and the inactive state is substantially radiation-opaque with the plurality of radiation-transparent apertures 20. The radiation-transparent apertures 20 permit the exposing of the radiation-sensitive material 4 to the desired exposure pattern when the radiation beam 18 is directed through the smart glass device 10.

In a particular example, the inactive state of the first switchable layer 12 is configured to provide a first desired exposure pattern, and the inactive state of the second switchable layer 14 is configured to provide a second desired exposure pattern. The first desired exposure pattern may be different from the second desired exposure pattern so that complex radiation-cured structures 4 may be formed. It should be appreciated that the exposure time may be lengthened or shortened as desired. Likewise, the exposure intensity may be increased or decreased as desired within the scope of the present disclosure. It should be appreciated that a formation of the radiation-cured structure 4 within the radiation-sensitive material 6 may be confined to an upper portion of the radiation-sensitive material through control of at least one of the exposure time and intensity.

Where the first and second switchable layers 12, 14 provide the first and second desired exposure patterns, the method of the disclosure may further include the step of switching the first switchable layer 12 to the inactive state and the second switchable layer to the active state 14. The first switchable layer 12 is thereby made radiation-opaque with the plurality of radiation-transparent apertures 20, and the second switchable layer 14 is made substantially radiation-transparent. The radiation-sensitive material 6 is then exposed to the first desired exposure pattern provided by the first switchable layer 12 in the inactive state. The first desired exposure pattern facilitates the formation of the first portion of the radiation-cured structure 4.

Following the step of exposure of the radiation sensitive material 4 to the first desired exposure pattern, the method includes the step of switching the first switchable layer 12 to the active state and the second switchable layer 14 to the inactive state. The first switchable layer 12 is thereby made substantially radiation-transparent, and the second switchable layer 14 is made substantially radiation-opaque with the plurality of radiation transparent apertures 20. The radiation sensitive material 4 is then exposed to the second desired exposure pattern provided by the second switchable layer 14 in the inactive state. The second desired exposure pattern facilitates the formation of the second portion of the radiation-cured structure. The second portion of the radiation-cured structure 4 may be different from the first portion of the radiation-cured structure 4, as desired.

One of ordinary skill in the art should appreciate that multilayered radiation-cured structures 4 may also be fabricated according to the method of the present disclosure. For example, the method may further include the step of applying an other radiation-sensitive material 6 to the radiation-cured structure 4 following the formation thereof. The other radiation-sensitive material 6 may then be exposed to at least one of the first and second desired exposure patterns, or other desired exposure patterns provided by other smart glass devices 10, to form further radiation-cured structure 4. In another embodiment, the method may include the step of applying multiple layers of radiation-sensitive material 6 to one another, the different layers having different radiation sensitivity, and selectively forming different radiation-cured structure 4 in each layer by exposure to different types of radiation. The layering of the respective radiation-sensitive materials 6 may include application of a solid film of radiation-sensitive material 6 to another solid film of radiation-sensitive material 6, or atop a reservoir of liquid radiation-sensitive material, prior to the selective exposure to radiation.

Where the radiation-sensitive material 6 is only initiated by the exposure to the radiation beam 18, it should be appreciated that the forming of the first radiation-cured structure 4 may include a post-processing step of heating the radiation-sensitive material 6 to complete at least one of polymerization, crosslinking, and dissociation of the radiation sensitive material 6. Where the radiation-sensitive material 6 is one of polymerized, crosslinked, and dissociated by the radiation beam 18, and where post-processing steps such as heating the initiated radiation-sensitive material have occurred, a step of removing excess or uncured radiation-sensitive material 6 is also employed. The radiation-cured structure 4 is thereby formed.

It should be understood that the method of the present disclosure can advantageously be employed to form radiation-cured structures 4 without having to set and remove multiple masks. One of ordinary skill in the art should appreciate that the system 2 and method of the present disclosure thereby mitigate the need for costly and inefficient masking techniques, processing steps, and related cleaning steps, typically associated fabrication of radiation-cured structures 4. Likewise, employment of the smart glass device 10 according to the present disclosure allows for a rapid and cost-effective formation of desired radiation-cured structures 4.

The method of the present disclosure further advantageously facilitates an alignment between different radiation-cured structures 4, even on free standing films or materials on elastic substrates. The present method also minimizes the position variations that typically result from moving the radiation-cured structures 4 or masks from one operating station to the next.

While certain representative embodiments and details have been shown for purposes of illustrating the invention, it will be apparent to those skilled in the art that various changes may be made without departing from the scope of the disclosure, which is further described in the following appended claims.

What is claimed is:

1. A method for fabricating a radiation-cured structure, the method comprising the steps of:
providing a radiation-sensitive material;
providing an at least one radiation source configured to project a radiation beam toward the radiation-sensitive material;
providing a smart glass device including at least one switchable layer selectively configurable from an active state to an inactive state and configured to expose the radiation-sensitive material to a desired exposure pattern when in one of the active state and the inactive state, wherein the at least one switchable layer includes a plurality of radiation-transparent apertures, the radiation-transparent apertures remaining radiation-transparent in both the active state and the inactive state of the at least one switchable layer;
positioning the smart glass device between the radiation-sensitive material and the at least one radiation source;
switching the at least one switchable layer to one of the active state and the inactive state; and
directing the radiation beam through the smart glass device to provide the desired exposure pattern, and exposing the radiation-sensitive material to the desired exposure pattern to form a radiation-cured structure.

2. The method of claim 1, wherein the smart glass device includes a first switchable layer and a second switchable layer, the first and second switchable layers disposed on a substantially radiation-transparent support, each of the first and second switchable layers independently selectively configurable from the active state to the inactive state, wherein the active state is substantially radiation-transparent and the inactive state is substantially radiation-opaque with the plurality of radiation-transparent apertures to expose the radiation-sensitive material to the desired exposure pattern, wherein the inactive state of the first switchable layer is configured to provide a first desired exposure pattern, and the inactive state of the second switchable layer is configured to provide a second desired exposure pattern, the first desired exposure pattern different from the second desired exposure pattern.

3. The method of claim 2, further comprising the steps of:
switching the first switchable layer to the inactive state and the second switchable layer to the active state; and
exposing the radiation-sensitive material to the first desired exposure pattern.

4. The method of claim 3, further comprising the steps of:
switching the first switchable layer to the active state and the second switchable layer to the inactive state following the step of exposing the radiation-sensitive material to the first desired exposure pattern; and
exposing the radiation-sensitive material to the second desired exposure pattern.

5. The method of claim 3, further comprising the steps of:
applying another radiation-sensitive material to the radiation-cured structure following the formation thereof; and
exposing the other radiation-sensitive material to the second desired exposure pattern.

6. The method of claim 2, wherein the first switchable layer abuts the second switchable layer, and the first switchable layer and the second switchable layer are laminated to the substantially radiation-transparent support.

7. The method of claim 2, wherein the each of the first switchable layer and the second switchable layer includes the plurality of radiation-transparent apertures.

8. The method of claim 7, wherein the plurality of radiation-transparent apertures of the first switchable layer are not aligned with the plurality of radiation-transparent apertures of the second switchable layer.

9. The method of claim 1, further comprising the step of heating the radiation-sensitive material following the step of exposing the radiation-sensitive material to the desired exposure pattern, the heating facilitating at least one of polymerization, crosslinking, and dissociation of the radiation-sensitive material to form the radiation-cured structure.

10. The method of claim 1, wherein the step of positioning the smart glass device between the radiation-sensitive material and the at least one radiation source includes placing the smart glass device atop the radiation-sensitive material.

11. The method of claim 1, further comprising the step of removing an uncured portion of the radiation-sensitive material following the step of forming the radiation-cured structure.

12. The method of claim 1, wherein the plurality of radiation-transparent apertures are defined by one of perforations and holes formed in the at least one switchable layer.

13. The method of claim 1, wherein the radiation-transparent apertures are in the form of substantially circular holes that provide radiation beams to form radiation-cured columns with substantially circular or elliptical cross-sectional shapes.

14. The method of claim 1, wherein the radiation-transparent apertures are elongate slots that provide radiation beams to form radiation-cured walls with substantially rectangular cross-sectional shapes.

15. The method of claim 1, wherein the radiation-cured structure is a fuel cell component.

16. The method of claim 15, wherein the fuel cell component is one of a diffusion medium, a bipolar plate, and a subgasket.

* * * * *